(12) United States Patent
Kwon

(10) Patent No.: US 6,236,594 B1
(45) Date of Patent: May 22, 2001

(54) FLASH MEMORY DEVICE INCLUDING CIRCUITRY FOR SELECTING A MEMORY BLOCK

(75) Inventor: Seok-Cheon Kwon, Sungnam (KR)

(73) Assignee: Samsung Eletronics Co., Ltd., Suwon (KR)

( * ) Notice: Subject to any disclaimer, the term of this patent is extended or adjusted under 35 U.S.C. 154(b) by 0 days.

(21) Appl. No.: 09/558,665

(22) Filed: Apr. 26, 2000

(30) Foreign Application Priority Data

Apr. 27, 1999 (KR) ................................................. 99-15077

(51) Int. Cl.[7] ............................ G11C 16/04; G11C 16/06
(52) U.S. Cl. ................................. 365/185.11; 365/185.23
(58) Field of Search ....................... 365/185.11, 185.05, 365/185.18, 185.23

(56) References Cited

U.S. PATENT DOCUMENTS 5,589,699 * 12/1996 Araki ..................................... 257/316
6,049,494 * 4/2000 Sakui et al. ........................... 365/203
6,128,230 * 10/2000 Amanai ............................ 365/185.23

* cited by examiner

Primary Examiner—Vu A. Le
Assistant Examiner—Anh Phung
(74) Attorney, Agent, or Firm—Marger Johnson & McCollom, P.C.

(57) ABSTRACT

A nonvolatile semiconductor memory device has a memory block including a string having a string select transistor responsive to a string select line, a ground select transistor responsive to a ground select line, and a plurality of EEPROM cells responsive to a corresponding plurality of word lines, the plurality of EEPROM cells being serially connected between the string select transistor and the ground select transistor. A first block select transistor is coupled to the ground select transistor. A second block select transistor is coupled to the string select transistor. A plurality of third block select transistors is coupled to the plurality of word lines. A voltage control means provides a first voltage to the first block select transistor and a second voltage to the third block select transistors, the first voltage being less than the second voltage during programming. According to the present invention, a voltage difference occurring between the gate and the drain of the first block select transistor is reduced. The result is a significant stress reduction on the first block select transistor.

17 Claims, 6 Drawing Sheets

FLASH MEMORY DEVICE INCLUDING CIRCUITRY FOR SELECTING A MEMORY BLOCK

FIELD OF THE INVENTION

The present invention relates to nonvolatile semiconductor memory devices and, more particularly, to a flash memory device including circuitry for selecting a memory block.

BACKGROUND OF THE INVENTION

Semiconductor memory devices for storing data are generally classified into volatile and nonvolatile semiconductor memory devices. When power is turned off, the volatile memory devices lose their data. The nonvolatile memory devices maintain their data even when the power is turned off. As such, the nonvolatile semiconductor memory devices are widely used in applications where power is suddenly interrupted.

One nonvolatile semiconductor memory device is a flash memory device. Flash memory devices comprise electrically erasable and programmable ROM cells that are referred to as flash EEPROM cells. A flash EEPROM cell generally includes a cell transistor that has a semiconductor substrate (or bulk) of a first conductivity type (e.g., P-type), source and drain regions of a second conductivity type (e.g., N-type) spaced from each other, a floating gate for storing charges and positioned over a channel region between the source and drain regions, and a control gate positioned over the floating gate.

As will be understood by those skilled in the art, a flash memory device might contain a column-by-column array of NAND EEPROM cells having the general construction illustrated in FIGS. 11.58 and 11.59, pp. 603–04, from *Semiconductor Memories* by B. Price et al., published by John Wiley & Sons Ltd. (1991), which is hereby incorporated by reference.

FIG. 1 is a block diagram of a conventional flash memory device having the above-mentioned cell structure. The conventional memory device 1 includes an array 10 divided into a plurality of memory blocks BLK0–BLKi. Each of the memory blocks BLK0–BLKi includes a plurality of strings illustrated in FIG. 2. Each string is connected to a corresponding bit line BLm (m=0–i), and has a string select transistor SST, a ground select transistor GST, and a plurality of flash EEPROM cell transistors Mn (e.g., n=0–15) connected in series between the source of the string select transistor SST and the drain of the ground select transistor GST. The drain of the string select transistor SST in each string is connected to a corresponding bit line BLi, the source of the ground select transistor GST is coupled to a common source line (or a common signal line) CSL. Gates of the string select transistors SST are commonly connected to a string select line SSL and gates of the ground select transistors GST are coupled in common to a ground select line GSL. Control gates of the flash EEPROM cell transistors M0–M15 in each string are commonly coupled to a corresponding one of word lines WL0–WL15. The bit lines BL0–BLi are electrically connected to a sense amplifier circuit 18 shown in FIG. 1. As is well known to those skilled in the art, the sense amplifier circuit 18 of the NAND-type flash memory device is composed of a plurality of page buffers (not shown).

Returning to FIG. 1, the conventional NAND-type flash memory device 1 further comprises a pre-decoder circuit 12, a block select circuit 14, a drive circuit 16, an Y-pass gate circuit 20, and an input/output buffer circuit 22. The block select circuit 14 selects one of the memory blocks BLK0–BLKi responsive to signals output from the pre-decoder circuit 12, and supplies the lines SSL, WL0–WLi, and GSL of the selected memory block with drive voltages from the drive circuit 16 depending on each of program and read modes of operation.

Referring to FIG. 2, a portion of a block select circuit 14 corresponding to a memory block BLKi is illustrated. Although not shown, block select circuits associated with other memory blocks will be configured the same as those shown in FIG. 2. The block select circuit 14 is composed of a block select signal generator 15 (serving as a block select decoder) for generating a block select signal BLSELi in response to a block select address. A plurality of block select transistors BT0–BT17 have sources connected to the string select line SSL, the word lines WL0–WL15, and the ground select line GSL. Drains of the transistors BT0–BT17 are connected to drive lines SS, CG0–CG15 and GS for transferring corresponding drive voltages from the drive circuit 16. The gates of the block select transistors BT0–BT17 are coupled in common to the block select signal generator 15 to receive the block select signal BSELi. Thus, the block select transistors BT0–BT17 are simultaneously turned on/off by the block select signal BSELi.

To program an EEPROM cell transistor in a selected memory block, a block select signal BSELi will be activated high. This causes the select transistors BT0–BT17 of the block select circuit 14 (corresponding to the selected memory block) to be simultaneously turned on. On the other hand, block select signals corresponding to deselected memory blocks are deactivated, turning off the select transistors BT0–BT17 of the deselected block select circuits. As a result, the string select line SSL, the word lines WL0–WL15, and the ground select line GSL of the selected memory block are electrically coupled to corresponding drive lines SS, CG0–CG15, and GS whereas the string select line SSL, the word lines WL0–WL15, and the ground select line GSL of respective deselected memory blocks float.

During the program mode of operation, the string and ground select lines SSL and GSL, respectively, of the selected memory block are respectively driven with voltages VCC and VSS through corresponding block select transistors BS0 and BS17. A selected one (e.g., WL0) of the word lines WL0–WL15 is driven with a program voltage Vpgm (e.g., 18V) through a corresponding block select transistor (e.g., BT1) while deselected wordlines (e.g., WL1–WL15) are respectively driven with a high voltage Vpass (e.g., 8V) through corresponding block select transistors (e.g., BT2–BT16). To drive the selected word line with the program voltage Vpgm and the deselected word lines with the high voltage Vpass, a voltage of the block select signal BSELi must be set at about Vpgm+Vth (Vth is the threshold voltage of each block select transistor).

Because of the above-mentioned bias condition for the block select transistors, a voltage difference of Vth between the gate and the drain of the transistor BT1 and a voltage difference of Vpgm−Vpass+Vth between the gate and the drain of each transistor BT2–BT16 develops. However, a voltage difference of about Vpgm+Vth occurs between the gate and the drain of the block select transistor BT17 coupled to the ground select line GSL. Similarly, a voltage difference of about Vpgm occurs between the gate and the drain of the block select transistor BT0 coupled to the string select line SSL. Thus, the block select transistors BT0 and BT17 are subjected to the stress of voltage differences between Vpgm+Vth and Vpgm resulting in a decline of their characteristics. By re-programming under the bias condition above described, the block select transistors BT0 and BT17 are subjected to even greater stress than other block select transistors BT1–BT16, resulting in an even greater decline of their characteristics.

SUMMARY OF THE INVENTION

It is therefore an object of the invention to provide a flash memory device including a block select circuit that minimizes the stress placed on block select transistors.

The nonvolatile semiconductor memory device of the present invention includes a memory block including a string having a string select transistor responsive to a string select line, a ground select transistor responsive to a ground select line, and a plurality of EEPROM cells responsive to a corresponding plurality of word lines, the plurality of EEPROM cells being serially connected between the string select transistor and the ground select transistor; a first block select transistor coupled to the ground select transistor. A second block select transistor is coupled to the string select transistor. A plurality of third block select transistors is coupled to the plurality of word lines. A voltage control means provides a first voltage to the first block select transistor and a second voltage to the third block select transistors, the first voltage being less than the second voltage during programming.

The voltage control means provides a third voltage to the second block select transistor, the third voltage being less than the second voltage during programming. The voltage control means includes a first node coupled to the ground select transistor. A second node is coupled to the plurality of third block select transistors. A logic circuit generates a logic signal by manipulating address signals, the logic signal being used to select the memory block. A switch circuit provides a block select signal to the second node responsive to the logic signal. A switching means generates the first voltage on the first node and providing the first voltage to the first block select transistor. The switching means comprises a field effect transistor having a gate, a drain, and a source, the gate receiving a shut off signal, the drain being coupled to the second node, and the source being coupled to the first node. The field effect transistor comprises one selected from a depletion-type MOS transistor and an enhancement-type MOS transistor.

In an alternative embodiment, the voltage control means comprises a first node coupled to the ground select transistor and the string select transistor. A second node is coupled to the plurality of third block select transistors. A logic circuit generates a logic signal by manipulating address signals, the logic signal being used to select the memory block. A switch circuit provides a block select signal to the second node responsive to the logic signal. A switching means generates the first voltage on the first node and providing the first voltage to the first and third block select transistors. The switching means comprises a field effect transistor having a gate, a drain, and a source, the gate receiving a shut-off signal, the drain being coupled to the second node, and a source being coupled to the first node. The field effect transistor comprises one selected from a depletion-type MOS transistor and an enhancement-type MOS transistor.

BRIEF DESCRIPTION OF THE DRAWINGS

The foregoing and other objects, features, and advantages of present invention will become more readily apparent from the following detailed description of a preferred embodiment that proceeds with reference to the following drawings. Like reference symbols indicate the same or similar components.

DESCRIPTION OF THE PREFERRED EMBODIMENT

Figure 1:
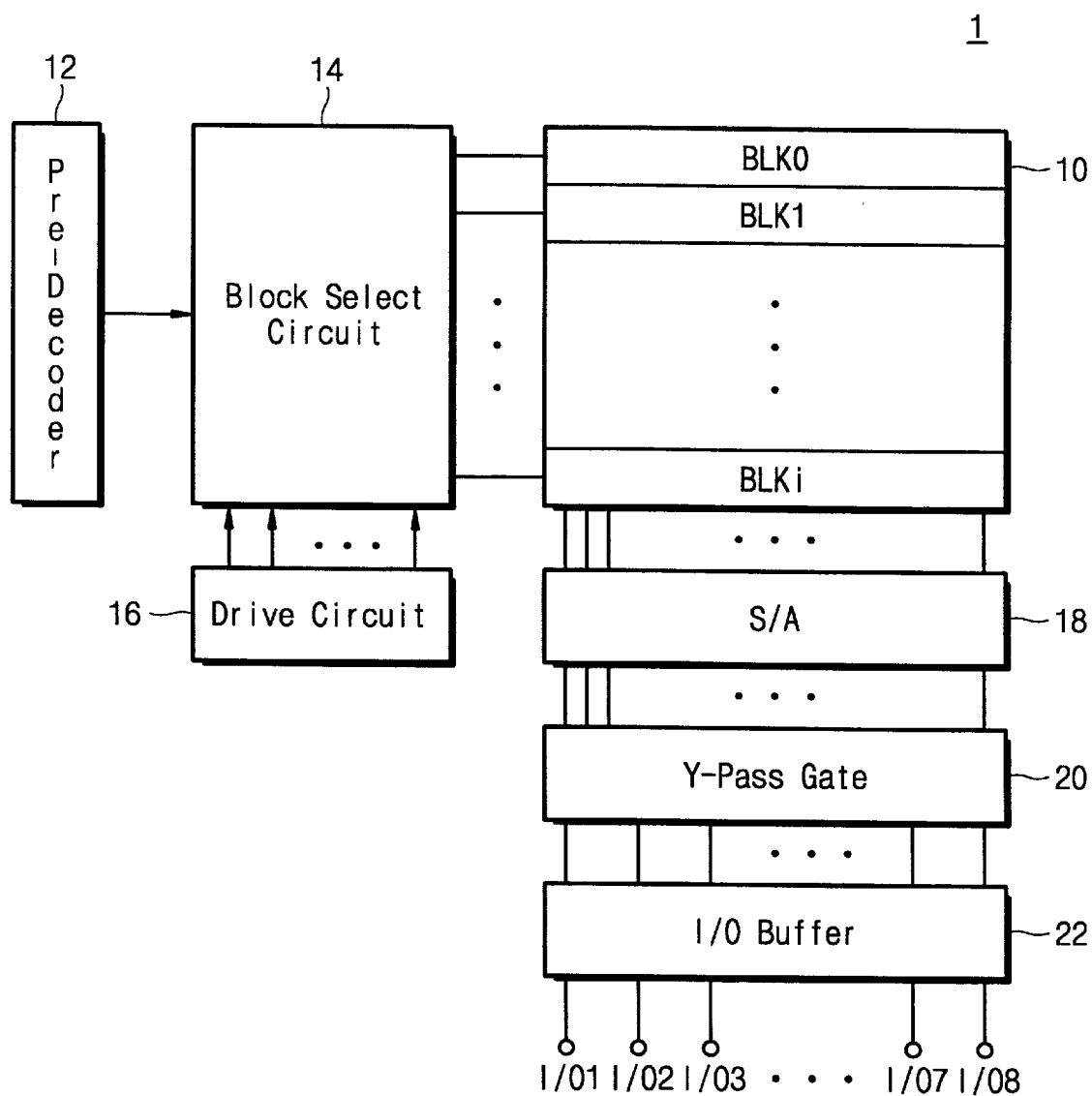
FIG. 1 is a block diagram of a conventional flash memory device.
Figure 2:
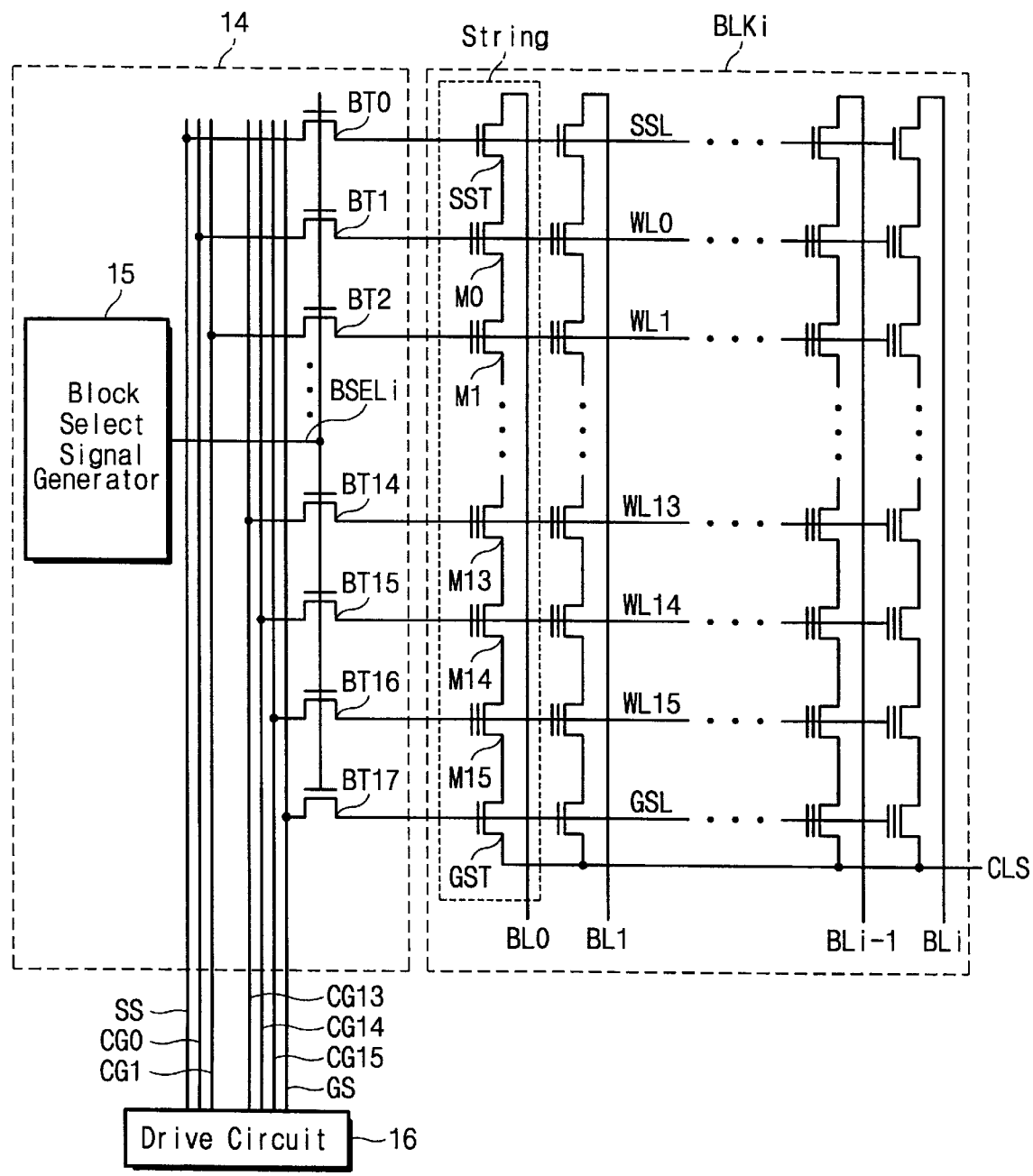
FIG. 2 is a portion of a block select circuit corresponding to the memory block shown in FIG. 1.
Figure 3:
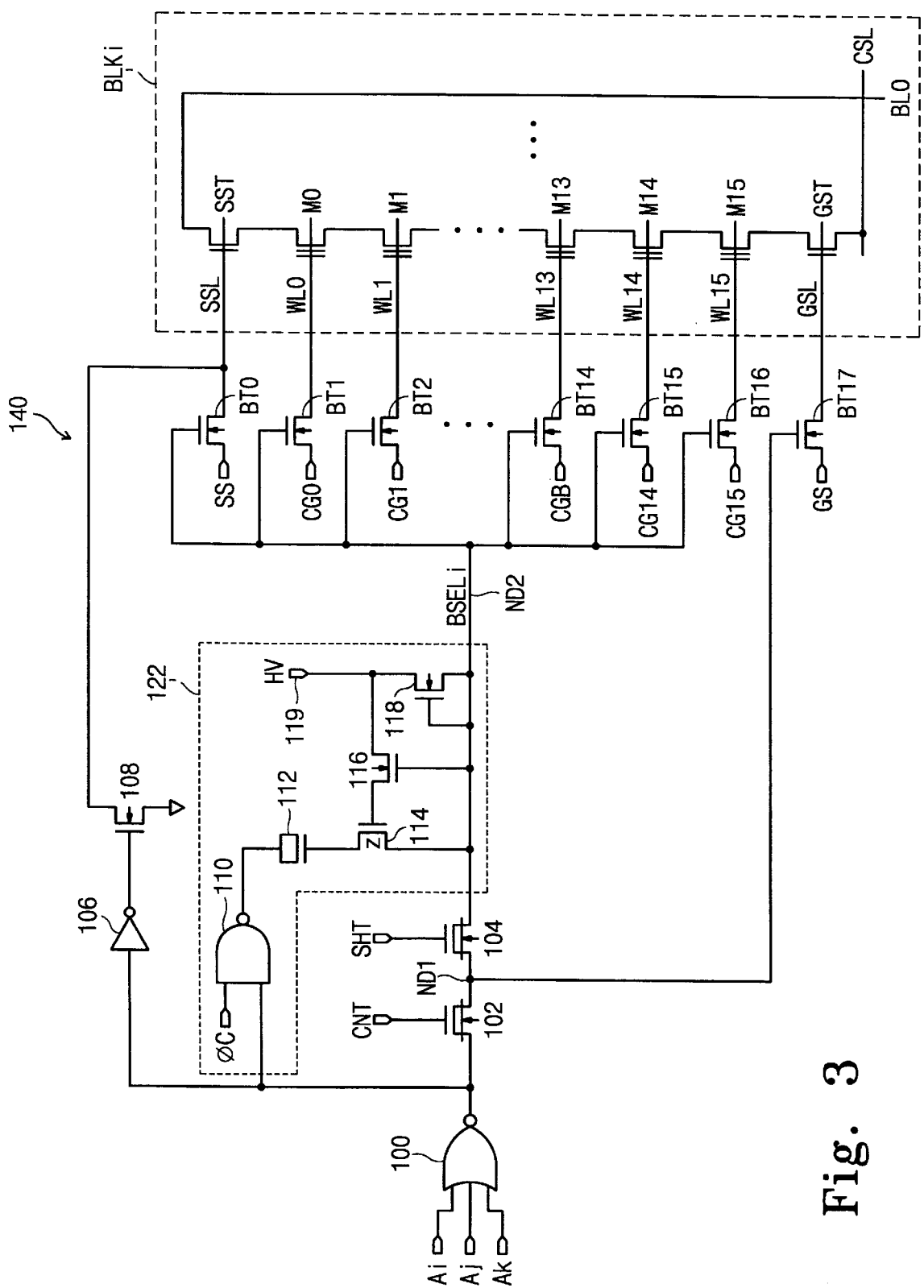
FIG. 3 is a first embodiment of a block select circuit according to the present invention.

The preferred embodiments of the invention will now be more fully described with reference to the attached drawings. FIG. 3 illustrates a block select circuit 140 according to the first embodiment of the present invention. The block select circuit 140 corresponds to one of memory blocks BLK0–BLKi shown in FIG. 1. The block select circuits corresponding to other memory blocks are configured the same as the block select circuit 140 shown in FIG. 3. In FIG. 3, the constituent elements that are identical to those shown in FIG. 2 are labeled with the same reference numeral, and description thereof is omitted.

Referring to FIG. 3, the block select circuit 140 generates a block select signal BSELi responsive to an address for selecting a corresponding memory block, and includes a NOR gate 100, two depletion-type NMOS transistors 120 and 104, an inverter 106, an NMOS transistor 108, and a high voltage switch 122. The NOR gate 100 receives address signals Ai, Aj, and Ak for selecting the memory block BLKi to then coding the received address signals Ai, Aj, and Ak. The depletion-type NMOS transistor 102 whose current path is formed between an output terminal and a first node ND1, has its gate connected to receive a control signal CNT. The signal CNT remains at a logic low level of a ground voltage during program and read modes of operation. The transistor 102 prevents a high voltage from being supplied to the NOR gate 100. A gate of the depletion-type NMOS transistor 104 is connected to receive a shut-off signal SHT and its current path is formed between the first node ND1 and a second node ND2 (or a signal line) for delivering the block select signal BSELi. Herein, the shut-off signal SHT remains at VCC during the program and read modes of operation. Alternatively, the shut-off signal SHT remains at Vread (e.g., 4V) during the read mode of operation. The inverter 106 and the NMOS transistor 108 ground the string select line SSL when the output signal of the NOR gate 100 is at a logic low level. On other words, the inverter 106 and the NMOS transistor 108 ground the string select line SSL of a deselected memory block.

Figure 4:
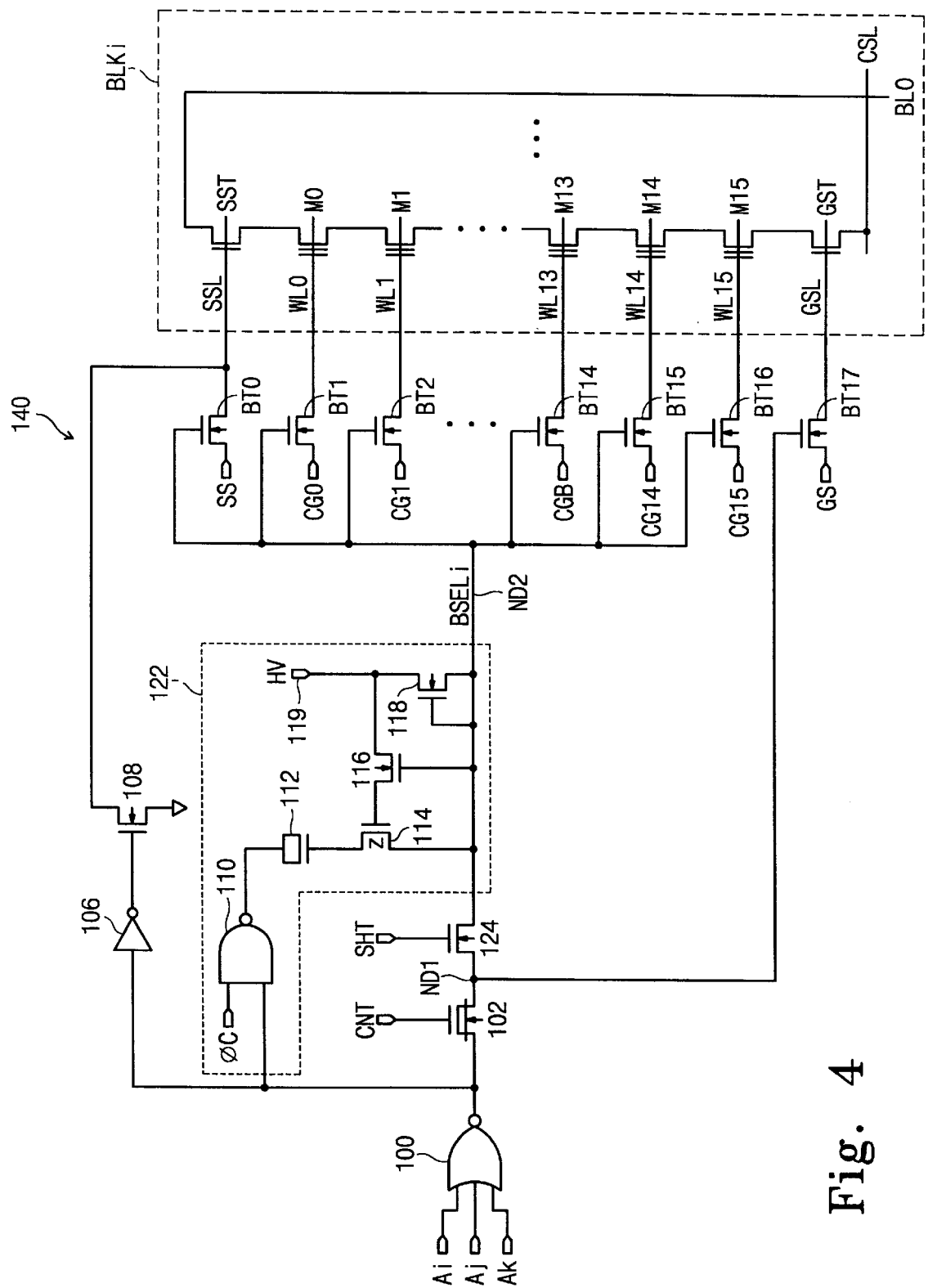
FIGS. 4 is a modified embodiment of the block select circuit shown in FIG. 3.

As illustrated in FIG. 4, an NMOS transistor 124 can replace the depletion-type NMOS transistor 104. A gate of the transistor 124 is connected to receive the shut-off signal SHT and its current path is formed between the first node ND1 and the second node ND2. In a case of using the NMOS transistor 124, the shut-off signal SHT remains at a voltage higher than VCC during the program and the read mode of operation such that VCC is sufficiently transferred to the string select line SSL. It is obvious to those skilled in the art that the depletion-type NMOS transistor 104 can be connected such that its current path is formed between the second node ND2 and the gate of the block select transistor BT17.

Continuing to refer to FIG. 3, the high voltage switch 122 includes a NAND gate 110, a MOS capacitor 112, three NMOS transistors 114, 116, and 118 connected as illustrated in FIG. 3. The high voltage switch 122 responds to the output signal of the NOR gate 100 and a clock signal φC to transfer a voltage of HV+Vth to the second node ND2. HV is the voltage supplied to an input terminal 199 during the program and read modes of operation and Vth is the threshold voltage of an NMOS transistor. For example, HV is about 18V during the program mode of operation and about 4V during the read mode of operation.

The block select circuit 140 further includes a plurality of block select transistors BT0–BT17 whose sources are coupled to the string select line SSL, the word lines WL0–WL15, and the ground select line GSL. Drains of the block select transistors BT0–BT17 are connected to drive lines SS, CG0–CG15, and GS to receive drive voltages from the drive circuit 16 shown in FIG. 2. Gates of the block select transistors BT0–BT16 are connected in common to the second node ND2 and a gate of the block select transistor BT17 is connected to the first node ND1.

It can be seen from the above description that the depletion-type NMOS transistor 104 is used to reduce the stress of the transistor BT17 by dropping the voltage of the second node ND2 and then supplying the dropped voltage as a gate voltage to the transistor BT17.

Before describing the operation of the block select circuit 140, assume that a memory cell M0 shown in FIG. 3 is selected for programming. Under this assumption, the word line WL0 coupled to the memory cell M0 will be driven with the program voltage Vpgm (e.g., 18V), and the word lines WL1–WL15 coupled to deselected memory cells M1–M15 will be driven with the pass voltage Vpass (e.g., 8V). The string select line SSL will be driven with a power supply voltage VCC, and the ground select line GSL will be driven with a ground voltage VSS. The voltage Vpgm is supplied to the input terminal HV of the high voltage switch 122.

During programming, the control signal CNT transitions from high (VCC) to low (VSS) and the shut-off signal SHT remains at VCC. The NOR gate 100 outputs a high signal in response to the address signals Ai, Aj, and Ak for selecting the corresponding memory block. The high voltage switch 122 transfers a voltage of HV+Vth (HV=Vpgm) to the second node ND2 when the output signal of the gate 100 transitions from low to high. When the first node ND1 is charged up to VCC+Vthd (VCC−(−Vthd), where Vthd is the threshold voltage of the depletion-type NMOS transistor), the depletion-type NMOS transistor 104 is shut off. Therefore, the voltage sum Vpgm+Vth is supplied to the gates of the block select transistors BT0–BT16 and the voltage sum VCC+Vthd is supplied to the gate of the block select transistor BT17.

As a result, the word line WL0 is connected to the driveline CG0 through the transistor BT1, the gate of which is supplied with the voltage Vpgm+Vth from node ND2. The word lines WL1–WL15 are connected to the drivelines CG1–CG15 through corresponding transistors BT2–BT16, each gate of which is supplied with the voltage sum Vpgm+Vth. The string select line SSL is connected to the driveline SS through the transistor BT0, the gate of which is supplied with the voltage sum Vpgm+Vth. On the other hand, the ground select line GSL is connected to the drive line GS through the transistor BT17, the gate of which is supplied not with the voltage sum Vpgm+Vth, but with the voltage sum VCC+Vthd.

During reading, the block select circuit 140 operates substantially the same as during programming except that the drive voltages are different from those applied during programming and the voltage HV is Vread (e.g., 4V). Since the voltages at the nodes ND1 and ND2 are VCC+Vthd and Vread+Vth, respectively, during reading, the string select line SSL is sufficiently driven with Vread, the ground select line GSL with VCC, the selected word line WL0 with VSS, and the deselected word lines WL1–WL15 with Vread.

In this embodiment, as described above, since the shut-off signal SHT remains at VCC during the program mode of operation, the depletion-type NMOS transistor 104 in FIG. 3 is shut off when a voltage of the first node ND1 reaches VCC+Vthd. And then, the voltage of VCC+Vthd is supplied to the gate of the block select transistor BT17 that is coupled to the ground select line GSL. Thus, the voltage difference between the gate and the drain of the transistor BT17 is reduced from Vpgm+Vth to VCC+Vthd, resulting in decreased stress on the transistor BT17.

Figure 5:
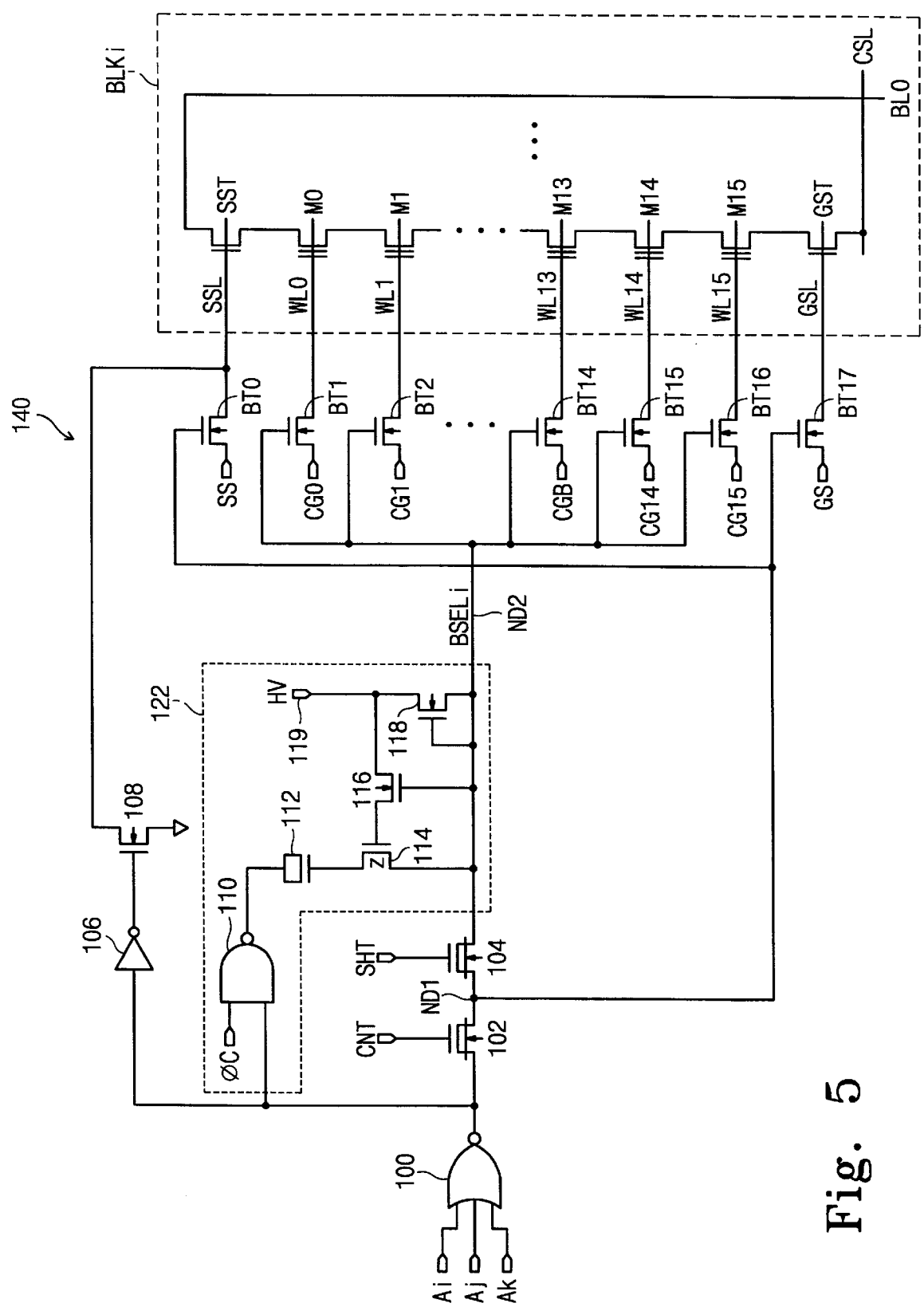
FIG. 5 is a second embodiment of a block select circuit according to the present invention.

FIG. 5 is a second embodiment of the block select circuit according to the present invention. In FIG. 5, the constituent elements that are identical to those in FIG. 3 are labeled with the same reference numerals, and description thereof is omitted. This embodiment differs from the first embodiment in that the gate of the block select transistor BT0 is connected not to the second node ND2, but to the first node ND1. Thus, similarly with the block select transistor BT17, the voltage difference between the gate and the drain of the transistor BT0 is reduced from Vpgm−VCC+Vth to VCC+Vthd. As a result, the second embodiment produces the same effect as the first embodiment, to wit, decreased stress on the transistor BT17.

Figure 6:
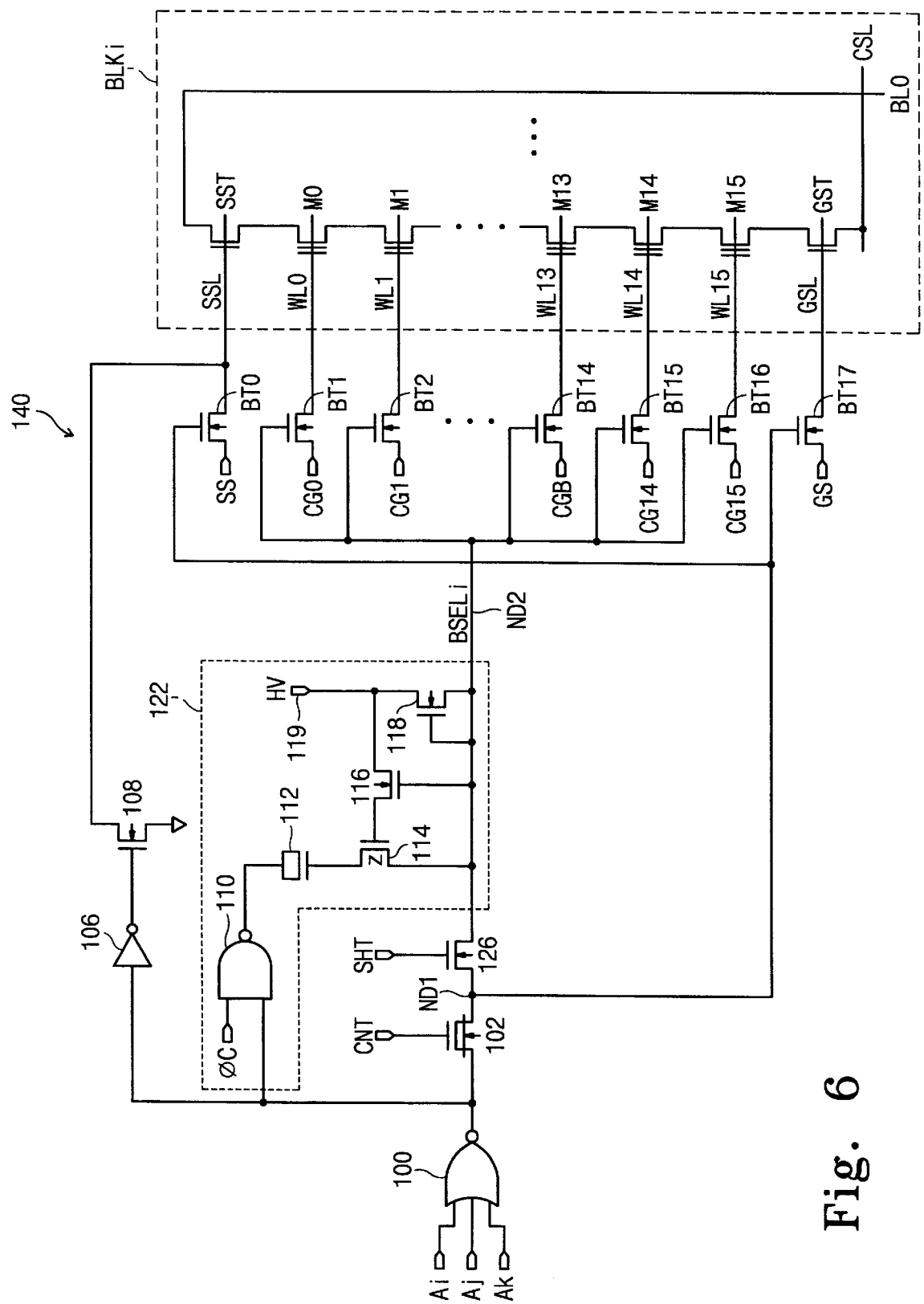
FIG. 6 is a modified embodiment of the block select circuit shown in FIG. 5.

As illustrated in FIG. 6, an NMOS transistor 126 the depletion-type NMOS transistor 104 shown in FIG. 3. A gate of the transistor 126 is connected to receive the shut-off signal SHT and its current path is formed between the first node ND1 and the second node ND2. In a case of using the NMOS transistor 126, the shut-off signal SHT remains at the voltage higher than VCC at programming and reading. It is obvious to those skilled in the art that the depletion-type NMOS transistor 104 can be connected such that its current path is formed between the second node ND2 and the gate of the block select transistor BT17.

Having illustrated and described the principles of my invention in a preferred embodiment thereof, it should be readily apparent to those skilled in the art that the invention can be modified in arrangement and detail without departing from such principles. The scope of the claims, therefore, should be accorded the broadest interpretation so as to encompass all such modifications and similar arrangements.

What is claimed is:

1. A nonvolatile semiconductor memory device, comprising:

a memory block including a string having a string select transistor responsive to a string select line, a ground select transistor responsive to a ground select line, and a plurality of memory cells responsive to a corresponding plurality of word lines, the plurality of memory cells being serially connected between the string select transistor and the ground select transistor;

a first block select transistor coupled to the ground select transistor;

a second block select transistor coupled to the string select transistor;

a plurality of third block select transistors coupled to the plurality of memory cells; and voltage control means for providing a first voltage to the first block select transistor and a second voltage to the third block select transistors, the first voltage being less than the second voltage during programming.

2. The nonvolatile semiconductor memory device of claim 1 wherein the voltage control means comprises:
   a first node coupled to the ground select transistor;
   a second node coupled to the plurality of third block select transistors;
   a logic circuit for generating a logic signal by manipulating address signals, the logic signal being used to select the memory block;
   a switch circuit for providing a block select signal to the second node responsive to the logic signal; and
   switching means for generating the first voltage on the first node and providing the first voltage to the first block select transistor.

3. The nonvolatile semiconductor memory device of claim 2 wherein the switching means comprises a field effect transistor having a gate, a drain, and a source, the gate receiving a shut off signal, the drain being coupled to the second node, and the source being coupled to the first node.

4. The nonvolatile semiconductor memory device of claim 3 wherein the field effect transistor comprises one selected from a depletion-type MOS transistor and an enhancement-type MOS transistor.

5. The nonvolatile semiconductor memory device of claim 1 wherein the voltage control means comprises:
   a first node coupled to the ground select transistor;
   a second node coupled to the string select transistor and the plurality of third block select transistors;
   a logic circuit for generating a logic signal by manipulating address signals, the logic signal being used to select the memory block;
   a switch circuit for providing a block select signal to the second node responsive to the logic signal; and
   switching means for generating the first voltage on the first node and providing the first voltage to the first and second block select transistors.

6. The nonvolatile semiconductor memory device of claim 5 wherein the switching means comprises a field effect transistor having a gate, a drain, and a source, the gate receiving a shut off signal, the drain being coupled to the second node, and the source being coupled to the first node.

7. The nonvolatile semiconductor memory device of claim 6 wherein the field effect transistor comprises one selected from a depletion-type MOS transistor and an enhancement-type MOS transistor.

8. The nonvolatile semiconductor memory device of claim 1 wherein the voltage control means comprises:
   a first node coupled to the ground select transistor and the string select transistor;
   a second node coupled to the plurality of third block select transistors;
   a logic circuit for generating a logic signal by manipulating address signals, the logic signal being used to select the memory block;
   a switch circuit for providing a block select signal to the second node responsive to the logic signal; and
   switching means for generating the first voltage on the first node and providing the first voltage to the first and second block select transistors.

9. The nonvolatile semiconductor memory device of claim 8 wherein the switching means comprises a field effect transistor having a gate, a drain, and a source, the gate receiving a shut-off signal, the drain being coupled to the second node, and a source being coupled to the first node.

10. The nonvolatile semiconductor memory device of claim 9 wherein the field effect transistor comprises one selected from a depletion-type MOS transistor and an enhancement-type MOS transistor.

11. A flash memory device, comprising:
    a memory block including a string coupled between a bit line and a source line, the string having a string select transistor responsive to a string select line, a ground select transistor responsive to a ground select line, and a plurality of memory cells responsive to a corresponding plurality of word lines, the plurality of memory cells being serially connected between the string select transistor and the ground select transistor;
    a first block select transistor coupled to the ground select transistor;
    a second block select transistor coupled to the string select transistor;
    a plurality of third block select transistors coupled to the plurality of memory cells;
    a logic circuit coupled to the first, second, and third block select transistors for generating a logic signal by manipulating address signals;
    a high voltage switch circuit coupled to the first, second, and third block select transistors for generating drive voltages corresponding to the first, second, and plurality of third block select transistors;
    a first switch coupled to the logic circuit and responsive to a first control signal; and
    a second switch coupled to the first switch and responsive to a second control signal.

12. The flash memory device of claim 11 wherein the second switch has a gate, a drain, and a source, the gate receiving the second control signal, the drain being connected to gates of the second and the plurality of third block select transistors, and the source being connected to a gate of the first block select transistor.

13. The flash memory device of claim 12 wherein the second switch is a depletion MOS device.

14. The flash memory device of claim 12 wherein the second switch is an enhancement MOS device.

15. The flash memory device of claim 11 wherein the second switch has a gate, a drain, and a source, the gate receiving the second control signal, the drain being connected to gates of the plurality of third block select transistors, and the source being connected to gates of the first and second block select transistors.

16. The flash memory device of claim 15 wherein the second switch is a depletion MOS device.

17. The flash memory device of claim 15 wherein the second switch is an enhancement MOS device.

* * * * *